United States Patent
Kraus et al.

(10) Patent No.: US 10,578,659 B2
(45) Date of Patent: Mar. 3, 2020

(54) METHOD AND SYSTEM FOR HOT SOCKET DETECTION AND TAMPERING DETECTION IN A UTILITY METER

(71) Applicant: Landis+Gyr LLC, Lafayette, IN (US)

(72) Inventors: Matthew Eric Kraus, Jamestown, IN (US); Detlef Griessman, West Lafayette, IN (US)

(73) Assignee: Landis+Gyr LLC, Lafayette, IN (US)

(\*) Notice: Subject to any disclaimer, the term of this patent is extended or adjusted under 35 U.S.C. 154(b) by 148 days.

(21) Appl. No.: 15/822,737

(22) Filed: Nov. 27, 2017

(65) Prior Publication Data

US 2019/0120885 A1 Apr. 25, 2019

Related U.S. Application Data

(60) Provisional application No. 62/574,958, filed on Oct. 20, 2017.

(51) Int. Cl.
| | | |
|---|---|---|
| *G01R 31/00* | (2006.01) | |
| *G01R 22/06* | (2006.01) | |
| *G01R 35/04* | (2006.01) | |
| *G01R 15/18* | (2006.01) | |
| *G01R 21/06* | (2006.01) | |
| *G01R 25/00* | (2006.01) | |

(52) U.S. Cl.
CPC ......... *G01R 22/066* (2013.01); *G01R 15/183* (2013.01); *G01R 21/06* (2013.01); *G01R 25/00* (2013.01); *G01R 35/04* (2013.01)

(58) Field of Classification Search
USPC .................................................. 324/74, 142
See application file for complete search history.

(56) References Cited

U.S. PATENT DOCUMENTS

| | | | | |
|---|---|---|---|---|
| 5,181,026 A | * | 1/1993 | Granville | G01R 15/183 324/96 |
| 2014/0077821 A1 | * | 3/2014 | Reed | G01R 31/04 324/538 |
| 2015/0212159 A1 | * | 7/2015 | Lu | G01R 15/183 324/765.01 |

\* cited by examiner

*Primary Examiner* — Vincent Q Nguyen
(74) *Attorney, Agent, or Firm* — Kilpatrick Townsend & Stockton LLP (57) ABSTRACT

A fault detection system of a utility meter for measuring electrical energy consumed by a load includes at least one current transformer, a temperature sensor, and a processor. The at least one current transformer is configured to generate a current measurement signal based on a current provided to the load. The temperature sensor is configured to generate a temperature signal based on a detected temperature of the utility meter. The processor is operably connected to the at least one current transformer and to the temperature sensor. The processor is configured to generate a phase angle value corresponding to a phase angle of the current measurement signal. The processor is further configured to generate a fault signal responsive to the temperature signal indicating that the detected temperature is greater than a predetermined temperature value and the phase angle value indicating detection of a leading current.

17 Claims, 6 Drawing Sheets

| Appliance | Voltage (RMS) | Power Factor | Wattage (Average Power) | Current | Phase Angle (degrees) | Real Current | Imaginary Current |
|---|---|---|---|---|---|---|---|
| HVAC (240Vac) | 240 | 0.8 | 2000 | 10.42 | 36.9 | 8.33 | 6.25 |
| Deep Freeze | 120 | 0.8 | 500 | 5.21 | 36.9 | 4.17 | 3.13 |
| LCD Television | 120 | 1 | 600 | 5.00 | 0.0 | 5.00 | 0.00 |
| CFL Light Bulb (x 10) | 120 | -0.61 | 200 | 2.73 | 307.6 | 1.67 | -2.17 |
| Stereo | 120 | 1 | 150 | 1.25 | 0.0 | 1.25 | 0.00 |
| Computer | 120 | 1 | 200 | 1.67 | 0.0 | 1.67 | 0.00 |
| Refrigerator | 120 | 0.8 | 600 | 6.25 | 36.9 | 5.00 | 3.75 |
| Dishwasher | 120 | 0.8 | 1200 | 12.50 | 36.9 | 10.00 | 7.50 |
| Ceiling Fans (x 3) | 120 | 0.8 | 25 | 0.26 | 36.9 | 0.21 | 0.16 |
| Inkjet Printer | 120 | 1 | 20 | 0.17 | 0.0 | 0.17 | 0.00 |
| Laptop Computer | 120 | 1 | 75 | 0.63 | 0.0 | 0.63 | 0.00 |
| Total | | 0.8619 | 5570 | 44.19 | 30.5 | 38.08 | 18.62 |

Typical Power Usage

FIG. 4

| Appliance | Voltage (RMS) | Power Factor | Wattage (Average Power) | Current | Phase Angle (degrees) | Real Current | Imaginary Current |
|---|---|---|---|---|---|---|---|
| CFL Light Bulb (x 10) | 120 | -0.61 | 200 | 2.73 | 307.6 | 1.67 | -2.17 |
| LCD Television | 120 | 1 | 600 | 5.00 | 0.0 | 5.00 | 0.00 |
| Total | | -0.9439 | 800 | 7.06 | -19.3 | 6.67 | -2.17 |

Negative Phase Non-Tampered

METHOD AND SYSTEM FOR HOT SOCKET DETECTION AND TAMPERING DETECTION IN A UTILITY METER

This application claims the benefit of priority of U.S. provisional application Ser. No. 62/574,958, filed on Oct. 20, 2017, the disclosure of which is herein incorporated by reference in its entirety.

FIELD

This disclosure relates to the field of utility meters, and particularly, to monitoring the operating condition of a utility meter.

BACKGROUND

Utility meters are devices that, among other things, measure the consumption of a utility-generated commodity, such as electrical energy, gas, or water, by a facility, such as a residence, a factory, or a commercial establishment. Utility service providers use utility meters to track customer usage of the utility-generated commodities for reasons including billing and demand forecasting of the commodity.

Electricity meters are utility meters configured to measure quantities related to the consumption of electrical energy by a facility or other load. In some instances, the electricity meter is received by a socket that is electrically connected to the utility-generated power source and to the electrical load of a customer. Electricity passes through current coils of the electricity meter as it flows between the power source and the electrical load. The electricity meter monitors the total amount of electrical energy that is provided to the load via the current coils and corresponding current transformers.

One type of undesirable condition that occurs in an electricity meter and socket is known as a "hot socket" condition. The hot socket condition occurs when the socket that receives the electricity meter ceases to transfer efficiently electrical energy resulting in heating of the electricity meter above a normal operating temperature range. In particular, as the socket ages, jaws within the socket may lose spring tension, such that a less reliable electrical connection exists between the socket and the electricity meter. Under certain conditions, the less reliable electrical connection may cause micro-arcing between the socket and the electricity meter, which undesirably results in an increase in temperature of the socket and the electricity meter. If the socket and the electricity meter are subject to the hot socket condition for an extended time period, then damage may result to at least one of the socket and the electricity meter and the customer is likely to experience a service interruption. Utility service providers desire early and accurate detection of the hot socket condition so that time is available for the service provider to take mitigating steps to correct the problem, to avoid losses, and, to prevent damage to the electricity meter.

Methods and systems for detecting the hot socket condition are known, including sensors that detect heat in the area of the current coils. However, these methods are not always as reliable as desired because the results are easily misinterpreted. For example, it is difficult for most hot socket detection systems to differentiate between the hot socket condition and the large temperature rise that occurs from natural environmental conditions, such as solar loading. Solar loading, which has nothing to do with the hot socket condition, occurs when the electricity meter experiences a significant increase in temperature due to exposure to direct sunlight. Misinterpretation of the results of known hot socket detection methods and systems causes customer dissatisfaction due to the possibility of an unplanned and unnecessary electrical service interruption.

Another type of undesirable condition is utility meter tampering, which includes unauthorized alterations to a utility meter. In the case of an electricity meter, tampering includes hampering the ability of the electricity meter to measure accurately energy consumption results. Tampering is typically performed to cause the electricity meter to measure less electrical energy consumption than is actually used and is a type of energy theft. Accordingly, methods of detecting and/or inhibiting meter tampering are of importance to the service provider to minimize energy theft.

Based on the above, a continuing need exists to increase the performance of utility meters so that the service provider is able to accurately and to reliably determine the operating state of the utility meter and, in particular, whether or not an electricity meter is undergoing the hot socket condition or has been tampered with.

SUMMARY

At least some embodiments of the disclosure address the above-stated needs, as well as others, by monitoring the operating temperature of the electricity meter and the polarity of a phase angle between the voltage and the current as measured by the electricity meter. Specifically, an elevated temperature of the electricity meter in combination with a leading phase angle is indicative of the hot socket condition. Moreover, a leading phase angle that persists for a duration greater than a predetermined time period is indicative of meter tamping.

An embodiment is a fault detection system of a utility meter for measuring electrical energy consumed by a load that includes at least one current transformer, a temperature sensor, and a processor. The at least one current transformer is configured to generate a current measurement signal based on a current provided to the load. The temperature sensor is configured to generate a temperature signal based on a detected temperature of the utility meter. The processor is operably connected to the at least one current transformer and to the temperature sensor. The processor is configured to generate a phase angle value corresponding to a phase angle of the current measurement signal. The processor is further configured to generate a fault signal responsive to the temperature signal indicating that the detected temperature is greater than a predetermined temperature value and the phase angle value indicating detection of a leading current.

Another embodiment is a utility meter for measuring electrical energy consumed by a load that includes at least one voltage sensor, at least one current sensor, a temperature sensor, and a processor. The at least one voltage sensor is configured to detect voltage representative of voltage provided to the load and to generate a voltage measurement signal based on the detected voltage. The at least one current sensor is configured to detect current representative of current provided to the load and to generate a current measurement signal based on the detected current. The temperature sensor is operably connected to detect a temperature of the utility meter and is configured to generate a temperature signal based on the detected temperature. The processor is operably connected to the at least one voltage sensor, the at least one current sensor, and the temperature sensor. The processor is configured to generate a phase angle value corresponding to a phase angle of the current measurement signal relative to a phase angle of the voltage measurement signal. The processor is further configured to generate a fault signal responsive to the temperature signal indicating that the detected temperature is greater than a predetermined temperature value and the phase angle value indicating that the detected current leads the detected voltage.

A further embodiment is a method of operating a fault detection system of a utility meter for measuring electrical energy consumed by a load. The method includes generating a current measurement signal based on a detected current corresponding to current provided to the load, generating a phase angle value representative of a phase angle of the current measurement signal, and determining a temperature value corresponding to a temperature of the utility meter. The method further includes generating a fault signal responsive to the determined temperature value indicating that the temperature of the utility meter is greater than a predetermined temperature value and the phase angle value corresponding to a leading current, and determining that the utility meter is undergoing a hot socket condition when the fault signal is generated.

The above-described features and advantages, as well as others, will become more readily apparent to those of ordinary skill in the art by reference to the following detailed description and the accompanying figures.

DETAILED DESCRIPTION

For the purpose of promoting an understanding of the principles of the disclosure, reference will now be made to the embodiments illustrated in the drawings and described in the following written specification. It is understood that no limitation to the scope of the disclosure is thereby intended. It is further understood that this disclosure includes any alterations and modifications to the illustrated embodiments and includes further applications of the principles of the disclosure as would normally occur to one skilled in the art to which this disclosure pertains.

Figure 1:
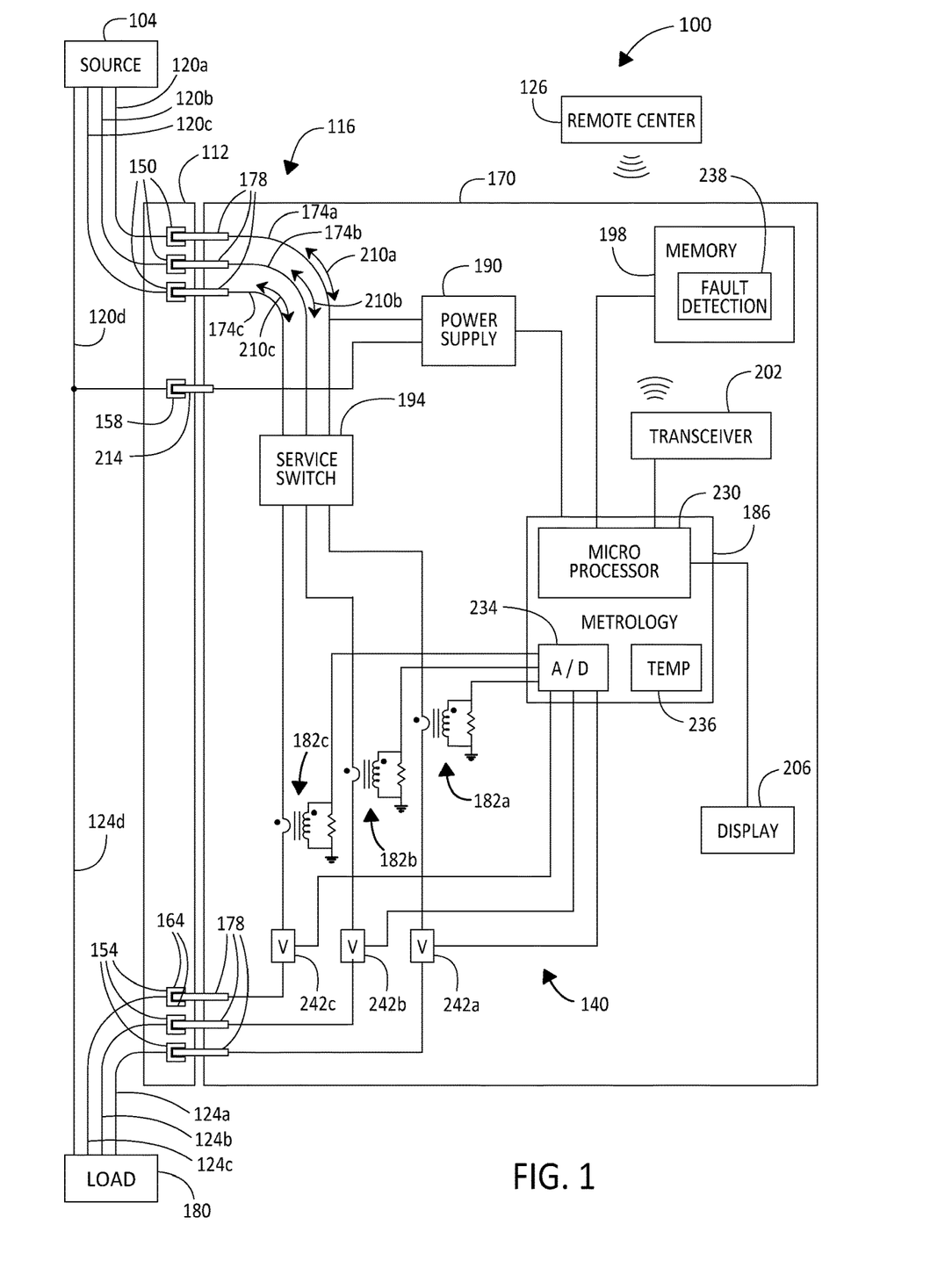
FIG. 1 is a schematic block diagram of a utility meter including a fault detection system as disclosed herein.

As shown in FIG. 1, a metering system 100 includes an electrical energy source 104, an electrical load 108, a mounting device 112, a utility meter 116 electrically connected to the mounting device 112, and a remote center 126 in electrical communication with the utility meter 116. Electrical power lines 120a, 120b, 120c electrically connect the source 104 to the mounting device 112 and the utility meter 116, and other electrical power lines 124a, 124b, 124c electrically connect the electrical load 108 to the mounting device 112 and the utility meter 116.

As disclosed in detail herein, the utility meter 116 includes a fault detection system 140 configured to identify phenomena indicative of the hot socket condition in which the utility meter 116 is undesirably heated above a normal operating temperature range or is heated above a predetermined temperature value. When the fault detection system 140 detects the hot socket condition, the utility meter 116 is configured, in one embodiment, to send a hot socket detection signal to the remote center 126 so that a utility operating the source 104 can take mitigating steps to prevent or minimize damage to the metering system 100 and the utility customer's property.

The fault detection system 140 is further configured to identify phenomena indicative of meter tampering. When the fault detection system 140 detects meter tampering, the utility meter 116 is configured, in one embodiment, to send a tampering detection signal to the remote center 126 so that the utility can take mitigating steps to prevent or to minimize energy theft and/or to prevent the consumption of electrical energy by the load 108. The components of the metering system 100 are described in detail herein.

With reference to FIG. 1, the source 104 generates electrical energy and is also referred to herein as a utility service provider, an electrical service provider, or the utility. The electrical energy is typically provided as an AC voltage exceeding one hundred volts and having a frequency of 50 Hz or 60 Hz. In the examples described herein, the source 104 provides electrical energy having a frequency of 60 Hz, as is typical in North America. In one embodiment, the source 104 includes a transformer (not shown) that is electrically connected to a power plant (not shown) and an associated distribution system (not shown) to receive electrical energy from the transformer. The source 104 typically scales the electrical energy to a level suitable for use with the load 108 and the utility meter 116. In the illustrated embodiment, the source 104 provides the AC power lines 120a, 120b, 120c with a three-phase four-wire service (including neutral line 120d), as is well-known in the art. However, the source 104 may additionally or alternatively provide electrical energy in any desired electrical service or configuration as required by the load 108 and the utility meter 116, such as single-phase electrical energy as is typically provided to residential customers.

The load 108 is an electrical load that consumes electrical energy from the source 104. The load 108 is illustrated as a consumer of three-phase four-wire electrical energy; however, in other embodiments, the load 108 is configured to consume any configuration of electrical energy, such as single-phase electrical energy. Thus, the load 108, for example, represents a combination of electrical energy consumers at a commercial or residential establishment.

The electrical power lines 120a, 120b, 120c conduct electrical energy between the source 104 and the utility meter 116 through the mounting device 112. The electrical load lines 124a, 124b, 124c, in turn, conduct electrical energy between the utility meter 116 and the load 108 through the mounting device 112. The power lines 120a, 120b, 120c include a phase A power line 120a, a phase B power line 120b, a phase C power line 120c, and neutral line 120d. Likewise, the load lines 124a, 124b, 124c include a phase A load line 124a, a phase B load line 124b, a phase C load line 124c, and a neutral line 124d. Each of the load lines 124a, 124b, 124c is coupled to the corresponding power line 120a, 120b, 120c via the meter 116 through the mounting device 112.

With continued reference to FIG. 1, the meter mounting device 112 mechanically and electrically connects the utility meter 116 to the source 104 and to the load 108. In this regard, the mounting device 112 includes three line-side sockets 150 physically and electrically connected to the power lines 120a, 120b, 120c, and three load-side sockets 154 physically and electrically connected to the load lines 124a, 124b, 124c. The mounting device 112 also includes a neutral line socket 158 coupled to the neutral lines 120d, 124d. The mounting device 112 is a physical interface to the load lines 124a, 124b, 124c and the power lines 120a, 120b, 120c for the utility meter 116.

The sockets 150, 154, 158 are formed from conductive metal and are configured to withstand high currents and voltages. In one embodiment, the sockets 150, 154, 158 are generally "U"-shaped and include arms 164, as shown in FIG. 1. The arms 164 are spring tensioned, such that the arms 164 are biased towards each other to promote reliable electrical contact with the corresponding portions of the utility meter 116 (i.e. the blades 178). The detailed structure of the sockets 150, 154, 158 is known to those of ordinary skill in the art and is dictated at least in part by ANSI standards. In other embodiments, the mounting device 112 includes any suitable number and configuration of sockets 150, 154, 158, as may be determined by the electrical power demands of the load 108.

The utility meter 116 is electrically connected to the source 104 and to the electrical load 108 through the sockets 150, 154, 158 of the mounting device 112. The utility meter 116 is configured to measure the consumption of electrical energy by the load 108, among other things. With reference to FIG. 1, the utility meter 116 includes a housing 170 at least partially containing a plurality of current coils 174a, 174b, 174c and corresponding blades 178. The utility meter 116 also includes current transformers 182a, 182b, 182c, a metrology unit 186, the fault detection system 140, a power supply 190, a service switch 194, a memory 198, a transceiver 202, and a display 206 each of which is at least partially located in the housing 170.

The current coils 174a, 174b, 174c of the utility meter 116 correspond to the phase A power line 120a, the phase B power line 120b, and the phase C power line 120c, respectively. The current coils 174a, 174b, 174c are electrical conductors (e.g. copper conductors) that are located at least partially within the housing 170 and are configured for electrical connection to the power lines 120a, 120b, 120c and the load lines 124a, 124b, 124c. Each current coil 174a, 174b, 174c is configured to couple the corresponding power line 120a, 120b, 120c to the respective load line 124a, 124b, 124c, via the sockets 150, 154. The power lines 120a, 120b, 120c, the current coils 174a, 174b, 174c, and the load lines 124a, 124b, 124c, thereby define three bi-directional circuit paths 210a, 210b, 210c for carrying electrical energy between the source 104 and the load 108.

Each respective current coil 174a, 174b, 174c includes two blades 178, which are configured to extend partially from the housing 170. The blades 178 are configured to provide a mechanically and electrically sound connection between the current coils 174a, 174b, 174c and the sockets 150, 154. In particular, each blade 178 is positioned between the arms 164 of a respective one of the sockets 150, 154. Moreover, in some embodiments, the current coils 174a, 174b, 174c and the blades 178 are configured to support mechanically the utility meter 116 in a mounted position (as shown in FIG. 1) on the mounting device 112. A blade 214 is also included to connect the utility meter 116 to the socket 158 of the neutral lines 120d, 124d.

With reference to FIG. 1, the blades 178 are typically formed from copper, a copper alloy, or another low electrical resistance material that efficiently conducts electrical energy. Typically, the blades 178 efficiently connect the current coils 174a, 174b, 174c to the sockets 150, 154 for many months or years without service or maintenance. The blades 178, like any electrical component, are subject corrosion and other deteriorating conditions; even more so when the utility meter 116 and the mounting device 112 are located outside and are exposed to temperature extremes and high humidity. When the blades 178 corrode or deteriorate, the blades 178 connect the current coils 174a, 174b, 174c to the sockets 150, 154 less electrically efficiently and electrical micro-arcing may occur, thereby resulting in undesirable heating of the current coils 174a, 174b, 174c or other components of the utility meter 116, eventually, in some situations, resulting in the hot socket condition.

Each current transformer 182a, 182b, 182c of the utility meter 116 is configured to generate an electronic current measurement signal based on a magnitude of the current flowing through a respective current coil 174a, 174b, 174c and provided to the load 108. Each of the current transformers 182a, 182b, 182c is substantially identical. The current transformers 182a, 182b, 182c are also referred to herein as current sensors configured to detect current representative of current provided to the load 108 and to generate the current measurement signal based on the detected current.

Figure 2:
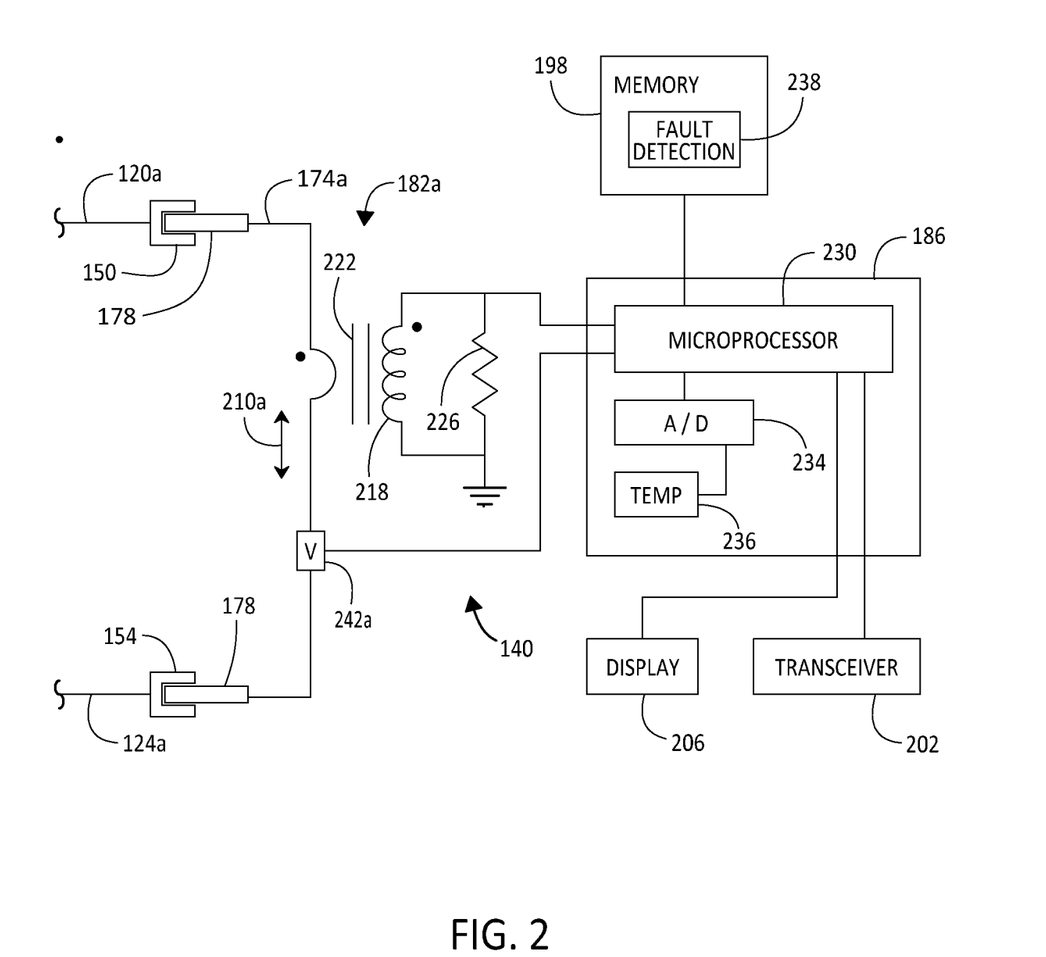
FIG. 2 is a schematic block diagram of a portion of the utility meter of FIG. 1.

As shown in FIG. 2, the current transformer 182a includes a current transformer winding 218, a core 222, and a burden resistor 226. The current transformer winding 218 and the core 222 are disposed on the circuit path 210a in a current sensing relationship with respect to the current coil 174a. The current transformer winding 218 and core 222 form a transformer with the current coil 174a. The current transformer winding 218 is electrically isolated from the current coil 174a. In one embodiment, the current coil 174a corresponds to a first winding or a "primary" winding and the current transformer winding 218 corresponds to a second winding or a "secondary" winding. The current transformer 182a is configured to detect a scaled version of the current passing through the current coil 174a and provided to the load 108 as the current measurement signal. The current measurement signal includes phase angle information of the current flowing through the current transformer winding 218. The current measurement signal has a magnitude suitable for processing by the low voltage metrology unit 186. That is, the current measurement signal of the current transformer winding 218 is typically one hundred to one thousand times less in magnitude than the magnitude of the current flowing through the circuit path 210a. The current transformers 182b, 182c are correspondingly configured.

As shown in FIG. 1, the core 222, in one embodiment, is a ferrous core having a corresponding magnetic permeability. As set forth herein, the magnetic permeability of core 222 is temperature dependent. Accordingly, the temperature of the utility meter 116, including the blades 178 and the sockets 150, 154, influences the magnetic permeability of the core 222. Typically, when the core 222 is heated sufficiently above a predetermined temperature value, the core 222 undergoes a decrease magnetic permeability. Moreover, when the utility meter 116 is undergoing the hot socket condition, the permeability of the core 222 is at a reduced level, which causes the current transformers 182a, 182b, 182c to exhibit a change in the phase angle of the current measured on the current transformer windings 218. Typically, the phase angle of the current measurement signal is shifted from a lagging or unity phase angle to a leading phase angle responsive to the decrease in magnetic permeability of the core 222.

The burden resistor 226 is operably connected to the current transformer winding 218. In particular, the burden resistor 226 is connected across the current transformer winding 218. All or most of the current in the current transformer winding 218 flows through the burden resistor 226. The current measurement signal generated by the current transformer 182a is based on the voltage dropped across the burden resistor 226 and is representative of the current provided to the load 108. An exemplary value of the burden resistor 226 is approximately one ohm (1Ω).

With reference again to FIG. 1, the memory 198 is operably coupled to the metrology unit 186 and is configured to store metering data generated by the metrology unit 186. Additionally, the memory 198 is configured to store program data referred to herein as a fault detection program 238 for operating the utility meter 116 according to a method 300 (FIG. 3) described below. The memory 198 further stores any other electronic data used or generated by the metrology unit 186, such as electronic fault data corresponding to faults detected by the fault detection system 140, including, for example, the date and time corresponding to each hot socket condition and meter tampering event. The memory 198 is also referred to herein as a non-transitory machine-readable storage medium. Moreover, the memory 198 and the fault detection program 238 are referred to herein as a phase angle detection circuit.

The metrology unit 186 includes a microprocessor 230, an A/D converter 234, and a temperature sensor 236. The microprocessor 230, which may also be provided as a microcontroller, a controller, a processor, or any other suitable circuit(s), is configured to generate metering data or consumption data by detecting, measuring, and determining one or more electricity and/or electrical energy consumption values based on electrical energy flowing between the sockets 150, 154, 158. To this end, the processor 230 is operably connected to the output of the current transformers 182a, 182b, 182d (through the A/D converter 234) to receive the electrical current measurement signals.

The A/D converter 234 is an analog to digital converter that is electrically connected to the processor 230, the current transformers 182a, 182b, 182c, the voltage sensors 242a, 242b, 242c, and the temperature sensor 236. The A/D converter 234 is configured to generate digital electrical current data based on the current measurement signal generated or output by the current transformer winding 218 of each current transformer 182a, 182b, 182c. The digital current data is used by the metrology unit 186 to, among other things, determine the electrical energy consumption values.

As shown in FIG. 1, the fault detection system 140 includes the current transformers 182a, 182b, 182c, voltage sensors 242a, 242b, 242c, the temperature sensor 236, the memory 198, and the metrology unit 186. The voltage sensors 242a, 242b, 242c are configured to generate an electrical voltage measurement signal based on a detected voltage provided to the load 108. The voltage measurement signal includes a magnitude and phase angle information of the voltage through the respective current coils 174a, 174b, 174c on the circuit paths 210a, 210b, 210c. The voltage sensor 242a is operably coupled to the phase A power line 120a and is configured to generate an electrical voltage measurement signal based on the voltage of the current coil 174a, the voltage sensor 242b is operably coupled to the phase B power line 120b and is configured to generate an electrical voltage measurement signal based on the voltage of the current coil 174b, and the voltage sensor 242c is operably coupled to the phase C power line 120c and is configured to generate an electrical voltage measurement signal based on the voltage of the current coil 174c. The voltage sensor 242a, 242b, 242c may suitably comprise a voltage divider or any other voltage sensing component. The electrical outputs of the voltage sensors 242a, 242b, 242c are operably coupled to the A/D converter 234. The A/D converter 234 is configured to generate digital voltage data based on the voltage measurement signal generated or output by the voltage sensors 242a, 242b, 242c. Moreover, the A/D converter 234 is configured to preserve the electrical phase information of the voltage measurement signals generated by the voltage sensors 242a, 242b, 242c.

The temperature sensor 236 is configured to generate an electrical temperature signal based on a detected temperature of the utility meter 116. The temperature as determined by the temperature sensor 236, in some instances, is related to the condition/remaining service life of the sockets 150, 154, 158. In particular, as the sockets 150, 154, 158 age, it is normal for the condition of the sockets 150, 154, 158 to deteriorate and/or to become corroded, dirty, worn out, defective, or otherwise less efficient at conducting electricity. The decrease in electrical efficiency of the sockets 150, 154, 158 may result in electrical arcing at the sockets 150, 154, 158 and the blades 178, 214 that generates a source of hot plasma. The hot plasma causes the sockets 150, 154, 158 and the other components within the housing 170, including the temperature sensor 236, to become hotter for a given amount of electrical current flowing therethrough, and may decrease the service life of the mounting device 112 and the utility meter 116. The fault detection system 140 is configured to monitor the temperature of the utility meter 116, as detected by the temperature sensor 236, as well as the current signals from the current transformers 182a, 182b, 182c in order to detect the hot socket condition and to determine when the sockets 150, 154, 158 should be serviced, replaced, and/or maintained. The electrical output of the temperature sensor 236 is electrically connected to the A/D converter 234, which is configured to generate digital temperature data based on the temperature measurement signal generated or output by the temperature sensor 236.

With reference to FIG. 1, the service switch 194, which is shown in the illustrated embodiment as a three-phase service switch, is operably coupled to the circuit paths 210a, 210b, 210c and to the metrology unit 186. The service switch 194 is configurable by metrology unit 186 in a closed state (i.e. a first operating state) and an open state (i.e. a second operating state). In the closed state, the service switch 194 is configured to form a closed circuit in each of the circuit paths 210a, 210b, 210c, which enables electrical energy transfer from the source 104 to the load 108 through the current coils 174a, 174b, 174c. In a three-phase system, the electrical energy supplied by each of the power lines 120a, 120b, 120c is applied to the load 108 when the three-phase service switch 194 is in the closed state. In the open state, the service switch 194 is configured to form an open circuit in the circuit paths 210a, 210b, 210c, which prevents electrical energy transfer from the source 104 to the load through the circuit paths 210a, 210b, 210c. The metrology unit 186 is configured to control the state of the service switch 194 based on the status of the fault detection system 140, the billing status of the customer associated with the load 108, and the consumption level of the load 108, among other factors. For example, the metrology unit 186 is configured to stop the flow of electrical energy to the load 108 by opening the service switch 194 when the fault detection system 140 detects the hot socket condition or meter tampering by opening the service switch 194.

The power supply 190 generates an electrical power output that is suitable for powering at least the electrical components of the utility meter 116 including the fault detection system 140, the metrology unit 186, the service switch 194, the memory 198, the transceiver 202, and the display 206. The power supply 190 is operably coupled to at least one circuit path 210a, 210b, 210c (as shown in FIG. 1) to supply power therefrom.

The transceiver 202 is operably coupled to the metrology unit 186 and is configured to send electric data to the source 104 and/or to the remote center 126, and to receive electric data from the source 104 and/or the remote center 126. In one embodiment, the transceiver 202 is a radio frequency ("RF") transceiver operable to send and to receive RF signals. In another embodiment, the transceiver 202 includes an automatic meter reading (AMR) communication module configured to transmit data to an AMR network and/or another suitable device. The transceiver 202 may also be configured for data transmission via the Internet over a wired or wireless connection. In other embodiments, the transceiver 202 is configured to communicate with an external device (not shown) or the source 104 by any of various means used in the art, such as power line communication, telephone line communication, or other means of communication.

The display 206 is operably coupled to the metrology unit 186 and is configured to display data associated with the utility meter 116 in a visually comprehensible manner. The display 206 may be configured to display the metering data generated by the metrology unit 186, the state of the service switch 194, and the electronic fault data generated by the fault detection system 140 that indicates whether or not the utility meter 116 is in the hot socket condition or has been tampered with. For example, at least a portion of the display 206 may be configured to illuminate in response to the metrology unit 186 generating a fault signal corresponding to the hot socket condition or meter tampering. The display 206 is provided as any desired display device, such as a liquid crystal display unit, for example.

The remote center 126 is electrically connected to the utility meter 116 and is configured to receive electrical data from the utility meter 116 and to send electrical data to the utility meter 116. The remote center 126 is configured to monitor the status of the utility meter 116 for faults detected by the fault detection system 140. In an alternative embodiment, the utility meter 116 and the remote center 126 may be connected via a wired connection, including but not limited to one that includes the power lines.

Figure 3:
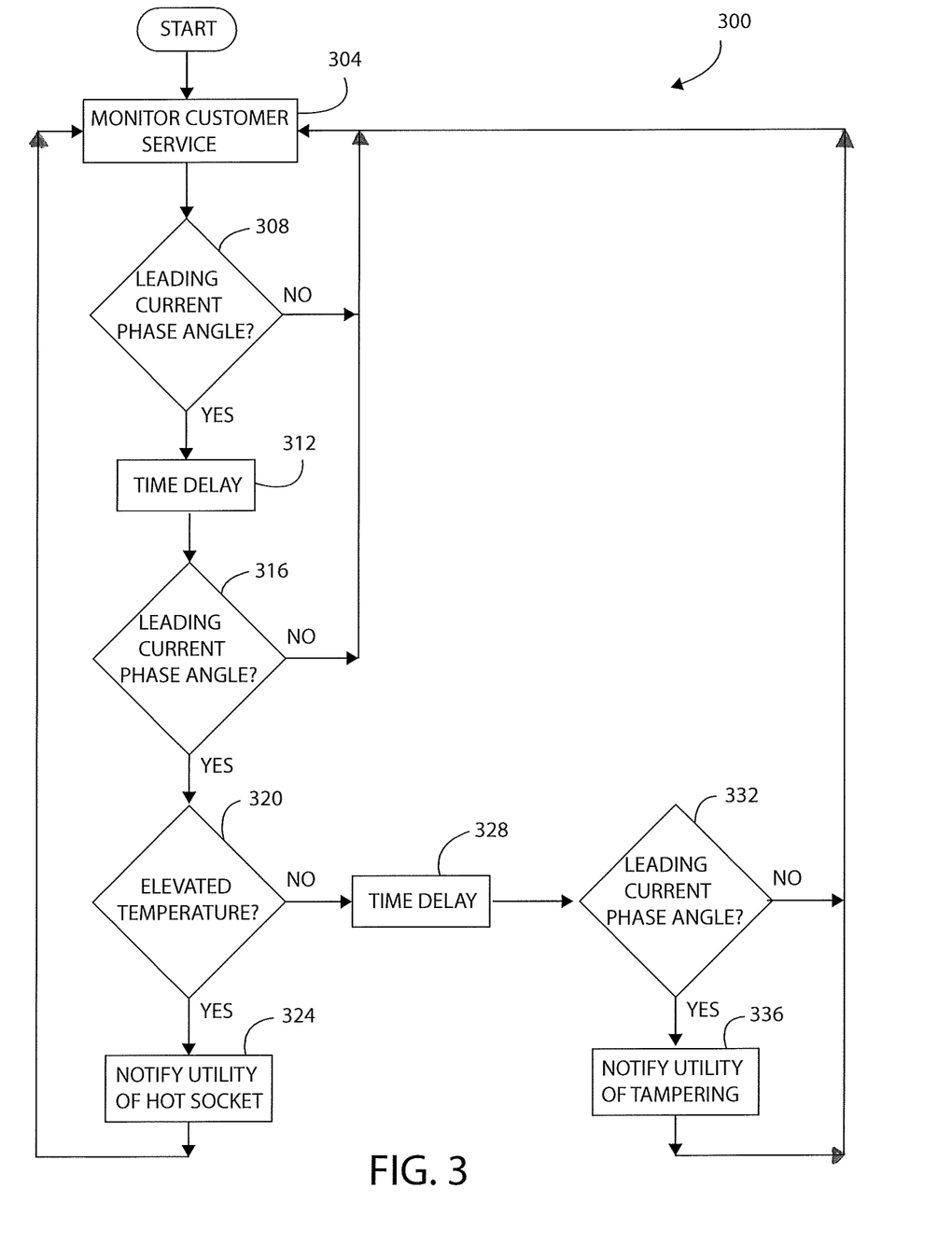
FIG. 3 is a flowchart illustrating an exemplary method of detecting faults in the utility meter of FIG. 1 with the fault detection system.

In operation, the system 100 is configured to operate the fault detection system 140 to monitor the utility meter 116 for the hot socket condition and for meter tampering faults according to the method 300 illustrated in the flowchart of FIG. 3. As shown in block 304, the method 300 begins by monitoring the electrical energy provided to the load 108 (i.e. the customer service) using the utility meter 116 to determine and to record the quantity of electrical energy consumed by the load 108.

Next, as shown in block 308, the method 300 includes using the fault detection system 140 to determine a phase angle value of the electrical current flowing through the current transformer winding 218 of at least one of the current transformers 182a, 182b, 182c. The phase angle value is indicative of faults in the utility meter 116. In short, a lagging phase angle value is typically indicative of a properly operating utility meter 116, and a leading phase angle value is typically indicative of a fault because, as set forth below, most loads 108 are inductive and result in a lagging phase angle value.

The processor 230 of the metrology unit 186 executes the fault detection program 238 to generate the phase angle value, which corresponds to the angle by which the current through the current transformer winding 218 of each current transformer 182a, 182b, 182c lags or leads the voltage as detected by the voltage sensors 242a, 242b, 242c. That is, the phase angle value is generated based on the phase angle of the current measurement signal and the phase angle of the voltage measurement signal. In the determining the phase angle value, the processor 230 processes the digital versions of the current measurement signal and the voltage measurement signal as output by the A/D converter 234.

In one embodiment, the processor 230 executing the fault detection program 238 determines the phase angle value from a calculated power factor value. In monitoring the customer service, the metrology unit 186 determines the power factor of the electrical energy supplied to the load 108, using, for example, at least two of a real power consumption value (kW), an apparent power consumption value (kVA), and a reactive power consumption value (kVAR). The power factor value may be determined by the metrology unit 186 according to any other process or method.

The processor 230 takes the arccosine of the determined power factor to arrive at the phase angle value. For example, if the determined power factor is 0.89 then the phase angle value is 26.95°. According to convention, since the power factor is positive so is the phase angle value, thereby indicating that the phase angle value corresponds to a lagging current. In another example, if the determined power factor is −0.98 then the phase angle value is −10.59°. Since the power factor is negative so is the phase angle value, thereby indicating that the phase angle value corresponds to a leading current.

In another embodiment, the processor 230 running the fault detection program 238 generates the phase angle value using zero crossing detection. To this end, the processor 230 determines a zero crossing of the digital current measurement signal (as output by the A/D converter 234) and a corresponding zero crossing of the digital voltage measurement signal (as output by the A/D converter 234). Then the processor 230 determines a time interval between the determined zero crossings. When the determined time interval is multiplied by 180 and divided by the period of the current measurement signal, the resultant is the phase angle value measured in degrees. Thus, in one embodiment, the phase angle value is determined according to the following formula: (determined time interval*180)/period. In the formula, the determined time interval and the period are measured in seconds. For example, the processor 186 determines that the digital voltage measurement signal crosses zero at time 0.0000 seconds and that the digital current measurement signal crosses zero at time 0.0025 seconds (indicating that the current is lagging the voltage as occurs in a typical inductive load). The determined time interval is 0.0025 seconds and the phase angle value is 26.95°. As another example, the processor 230 determines that the digital current measurement signal crosses zero at time −0.0010 seconds and that the digital voltage measurement signal crosses zero at time 0.0000 seconds, indicating that the current is leading the voltage as occurs in a typical capacitive load. The determined time interval is −0.0010 seconds and the phase angle value is −10.59°.

In other embodiments, the fault detection system 140 detects the phase angle value according to any other known method or process using the electrical quantities typically measured and determined by the metrology unit 186.

Figure 4:
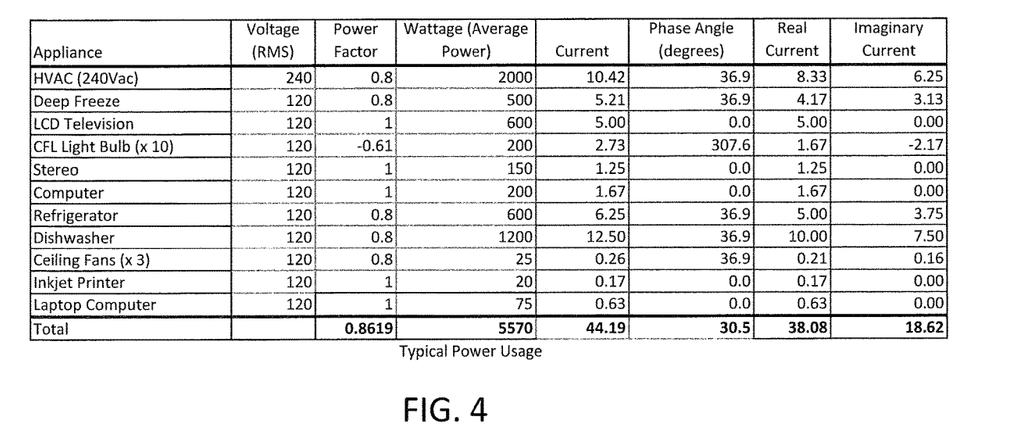
FIG. 4 is a chart including electrical quantities associated with a typical customer load having a lagging phase angle and a positive power factor.

To illustrate the relationship between the phase angle value and the type of load 108, FIG. 4 illustrates an exemplary chart based on the power usage of a typical residential customer load 108. The customer has various appliances (i.e. the load 108) electrically connected to the source 104 through the utility meter 116. In total, the load 108 draws 5.57 kW of electrical power from the source 104 and 44.19 A of electrical current from the source 104. The processor 230, for example, uses the current measurement signal from the current transformers 182a, 182b, 182c and the voltage measurement signal from the voltage sensors 242a, 242b, 242c to arrive at a power factor of 0.86, which corresponds to a phase angle value of 30.5°. The positive power factor and positive phase angle value indicates that the load 108 in FIG. 4 is lagging, as is typically the case in a normal residential load 108 and in a utility meter 116 that is operating within normal operating parameters.

As shown in block 308, if after determining the phase angle value, the processor 230 determines that the load 108 results in a current measurement signal having a lagging phase angle value (i.e. a positive power factor), then the processor 230 continues to monitor the customer service in block 304 and determines that no faults are present. If, however, the processor 230 determines that the load 108 results in a current measurement signal having a leading phase angle value (i.e. a negative power factor), then the processor 230 implements a time delay as shown in block 312 of the flowchart of FIG. 3.

Figure 5:
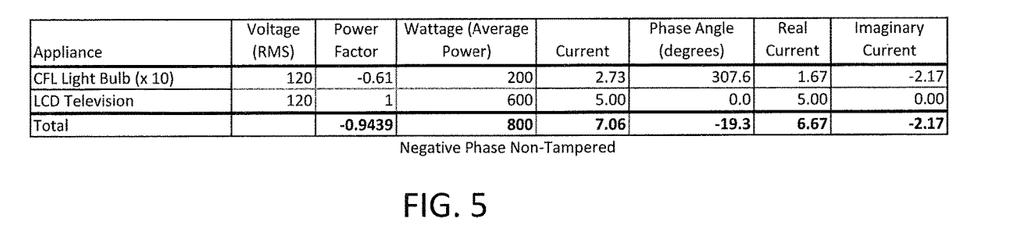
FIG. 5 is a chart including electrical quantities associated with a customer load having a leading phase angle and a negative power factor.

The time delay of block 312 is initiated because only certain instances of a leading phase angle value are indicative of faults with the utility meter 116. For example, as shown in the chart of FIG. 5 another customer load 108 includes fewer appliances, but certain appliances that result in a negative power factor and negative phase angle value, such as ten compact fluorescent light bulbs ("CFLs") and an LCD television, which have a total power factor of −0.94 and result in a phase angle value of −19.3°, as determined by the processor 230. The CFLs are the dominant electrical load in determining the overall phase angle and power factor of the customer load 108 in FIG. 5. The customer of FIG. 5 has not tampered with the utility meter 116 and the utility meter 116 is operating normally. Thus, the customer load of FIG. 5 is an example of when a leading phase angle value is not indicative of a fault.

The time delay of block 312 is, in one embodiment, a predetermined time period of thirty minutes. The time delay reduces false positive fault detections by the fault detection system 140 by preventing the generation of fault data and the fault signal when the load 108 only briefly results in a negative phase angle and a negative power factor. The chart of FIG. 5 shows that some normal customer loads 108 result in a negative phase angle and a negative power factor, but these loads 108 are typically short-lived and do not persist for longer than thirty minutes. For example, the customer of FIG. 5 is likely to have an HVAC system (a typically large inductive load) and/or a refrigerator. When either of these appliances becomes energized, the load 108 of FIG. 5 will become inductive (lagging current, positive phase angle, and positive power factor as detected by the fault detection system 140). Typically, at least one of these appliances will activate at least once in a thirty-minute time period to draw the leading load 108 of FIG. 5 back to a lagging load, as is typically expected. In other embodiments, the predetermined time period of the time delay of block 312 has a duration of one minute to twelve hours.

In block 316, subsequent to the time delay of block 312, the method 300 includes using the fault detection system 140 again to determine the phase angle value and the power factor. If the phase angle value and power factor of the current measurement signal are positive in block 316 (i.e. no leading current), then the processor 230 continues to monitor the customer service, as shown by the return to block 304 in the flowchart of FIG. 3. If, however, the phase angle value and the power factor in block 316 are still negative (i.e. a leading current), then the processor 230 determines the temperature of the utility meter 116.

In block 320, the processor 230 includes determining the temperature of the utility meter 116. A temperature of the utility meter 116 above the predetermined temperature value in combination with a leading current (negative phase angle value and negative power factor) of the current measurement signal is an indication that the utility meter 116 is undergoing the hot socket condition. The fault detection system 140 determines the temperature of the utility meter 116 by monitoring the temperature signal as detected by the temperature sensor 236 with the processor 230. Specifically, the processor 230 compares the detected temperature value to the predetermined temperature value. An exemplary predetermined temperature value is about 200° F. In other embodiments, the predetermined temperature value is from 180° F. to 300° F.

If, in block 320, the processor 230 determines that the temperature sensor 236 has detected a temperature that is greater than the predetermined temperature value, then the fault detection system 140 determines that the utility meter 116 is undergoing or is potentially undergoing the hot socket condition. Accordingly, as shown in block 324, the metrology unit 186 generates the hot socket detection signal, which is also referred to herein as a fault signal. In one embodiment, the processor 230 causes the transceiver 202 to send the hot socket detection signal to the remote center 126 in order to notify the utility that the utility meter 116 may require servicing. In response to receiving the hot socket detection signal, the utility may send a technician to the utility meter 116 to diagnose further the fault detected by the fault detection system 140. In other embodiments, the processor 230 causes the transceiver 202 to send the hot socket detection signal to at least one of the customer, a technician, and the source 104 using AMR or the like. In another embodiment, the hot socket detection signal is transmitted to the remote center 126 by a wired connection.

Moreover, in some embodiments, in block 324 in addition to generating the hot socket detection signal, the metrology unit 186 may also cause the service switch 194 to open thereby preventing the flow of electrical energy through utility meter 116 and to the load 108. Preventing the flow of electrical energy through the utility meter 116 at least temporarily resolves the hot socket condition by allowing the utility meter 116 to cool down at the expense of a service disruption to the load 108 and the customer. The metrology unit 186 may also illuminate at least a portion of the display 206 to indicate to a local observer that the utility meter 116 is exhibiting symptoms of the hot socket condition.

The method 300 includes determining the phase angle value (blocks 308 and 316) in addition to determining the temperature of the utility meter 116 (block 320) as confirmation that the utility meter 116 is undergoing the hot socket condition. Specifically, an elevated temperature of the utility meter 116 is only sometimes an indication that the utility meter 116 is undergoing the hot socket condition. The temperature of the utility meter 116 as determined by the temperature sensor 236 is influenced by factors other than the condition of the sockets 150, 154, 158, such as environmental conditions; thus, the temperature of the utility meter 116 alone is typically an insufficient indicator of whether or not the utility meter 116 is undergoing the hot socket condition. For example, in some climates solar heating may temporarily increase the temperature of the utility meter 116 above the predetermined temperature value as determined by the temperature sensor 236 even when the sockets 150, 154, 158 and the utility meter 116 are operating normally. Solar heating occurs when sunlight directly or indirectly heats the utility meter 116. Solar heating, however, does not heat the utility meter 116 enough to change the magnetic permeability of the cores 222 and to affect the phase angle of the current flowing the current transformer windings 218 (i.e. the phase angle value). Whereas, when the utility meter 116 is undergoing the hot socket condition, the current transformers 182a, 182b, 182c are affected and exhibit a change in phase angle on the current transformer windings 218. For at least these reasons, in addition to monitoring the temperature of the utility meter 116, the method 300 also accounts for the phase angle of the current measurement signal in order to discriminate the hot socket condition from solar heating. The relationship between the phase angle value and the temperature of the utility meter 116 is set forth below.

Figure 6:
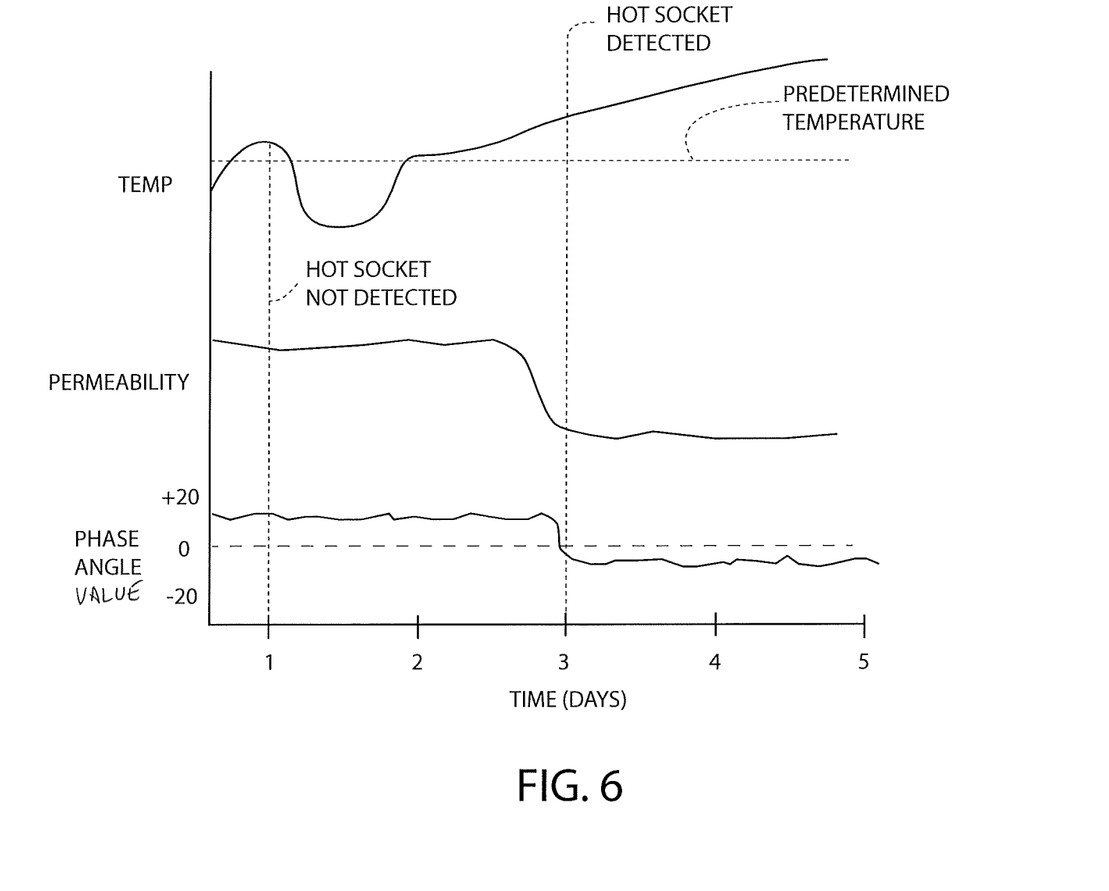
FIG. 6 is a graph of temperature, permeability, and phase angle versus time for the utility meter of FIG. 1 showing the effects of the hot socket condition.

As shown in FIG. 6, the measured temperature of the utility meter 116, the magnetic permeability of the core 222, and the phase angle of the current through the current transformer windings 218 (i.e. the phase angle value) are graphed versus time. The temperature graph shows that the temperature measured by the temperature sensor 236 cycles up and down due to the effects of solar heating from day zero to day two. The utility meter 116 cools off when the sun stops striking the utility meter 116 in the evening and at night, as shown by the reduced temperature at day 1.5. In this example, the temperature of the utility 116 exceeds the predetermined temperature value associated with the hot socket condition for certain periods of the day (for example at time 0.5) due to solar heating; however, the fault detection system 140 determines in block 308 that the utility meter 116 is not undergoing the hot socket condition at time 0.5 because the phase angle value is not leading (i.e. is lagging). The phase angle value, as determined by the fault detection system 140, is largely unaffected by the changing temperature of the utility meter 116 due to solar heating.

In FIG. 6, the utility meter 116 experiences a fault at time 2.0 days, which causes the measured temperature of the utility meter 116 to rise well above the predetermined temperature value that is associated with the hot socket condition. In this example, the fault includes reduced electrical efficiency of the sockets 150, 154, 158. The fault is apparent after time 2.0 days because the temperature of the utility meter 116 stops cycling due to the effects of solar heating. The fault is also apparent from the change in phase angle value that occurs at about time 3.0 days in combination with the elevated temperature of the utility meter 116. When the measured temperature exceeds the predetermined temperature value by any significant extent, the cores 222 of the current transformers 182a, 182b, 182c undergo a sharp drop in magnetic permeability. The decrease in magnetic permeability occurs because thermal agitation of magnetic domains in the cores 222 caused by the increased temperature increases the reluctance of the core 222 in the presence of a magnetic field from the current in the current paths 210a, 210b, 210c. An effect of the decrease in magnetic permeability of the cores 222 is that the phase angle of the current measurement signal through the current transformer windings 218 is shifted towards a leading value relative to the voltage as detected by the voltage sensors 242a, 242b, 242c. Moreover, the power factor of the current measurement signal through the current transformer windings 218 tends towards a negative value. In this example, after the measured temperature is sufficiently above the predetermined temperature value, the phase angle value changes from a positive value (i.e. a lagging phase angle) to a negative value (i.e. a leading phase angle) at around time 3.0 days.

The phase angle value is dependent on the temperature of the utility meter 116 and is used by the processor 230 as confirmation that the utility meter 116 is undergoing the hot socket condition and is not simply experiencing solar heating. In this way, the fault detection system 140 is configured to discriminate the hot socket condition from other heating events, such as solar heating. In FIG. 6, the load 108 is unchanged or is substantially unchanged from time 0 through 4.0 days. The change in phase angle value is not due to a change in the load 108 and is not indicative of a changed phase angle in the current through the circuit paths 210a, 210b, 210c or the current coils 174a, 174b, 174c. Instead, the shifted phase angle value is a result of the decrease in permeability of the cores 222 that occurs when the current transformers 182a, 182b, 182c are heated above the predetermined temperature value. Thus, the change in phase angle value is an accurate predictor of the hot socket condition.

With reference again to block 320 of FIG. 3, in addition to detecting the hot socket condition, the fault detection system 140 also detects meter tampering faults. In particular, if the fault detection system 140 determines that the measured temperature is less than or equal to the predetermined temperature value, then in block 320 the processor 230 determines that the utility meter 116 is not undergoing the hot socket condition and the processor 230 institutes another time delay. At block 328, the processor 230 has determined that the current measurement signal has a leading phase angle value and the measured temperature is less than the predetermined temperature value. Such a state may be caused by atypical loads (such as many CFLs, see FIG. 5) or by user tampering. Accordingly, the processor 230 institutes the time delay of block 328 to determine if the leading current is a temporary condition caused by an intermittent atypical leading load (i.e. a capacitive load) or is the result of meter tampering. Typically, the time delay of block 328 is longer than the time delay of block 312. In one embodiment, the time delay of block 328 is a predetermined time period of six hours. In other embodiments, the duration of the predetermined time period associated with the time delay of block 328 is one hour to twelve hours.

Next, at block 332 the processor 230 checks again to determine if the current measurement signal has a leading phase angle value. If the current is not leading the voltage, then the processor 230 determines that the event resulting in the leading current has subsided and the processor 230 continues to monitor the customer service at block 304. Thus, the processor 230 determines that no fault has occurred (i.e. no hot socket condition and no meter tampering) if the current is lagging the voltage at block 332. If, however, in block 332 the current measurement signal still has a leading phase angle value, then meter tampering is suspected.

In response to the suspected meter tampering, in block 336, the fault detection system 140 generates an electronic tampering detection signal (i.e. another fault signal, a meter tampering signal) and is prevented from generating the hot socket detection signal of block 324. In one embodiment, the fault detection system 140 includes using the transceiver 202 to send wirelessly the tampering detection signal to the remote center 126. In response to receiving the tampering detection signal, the utility may send a technician to the utility meter 116 to diagnose further the fault detected by the fault detection system and to determine more accurately if any type of meter tampering has occurred. In another embodiment, the processor 230 causes at least a portion of the display 206 to illuminate responsive to generation of the tampering detection signal. Moreover, the tampering detection signal may include a message to the customer to check the area near the utility meter 116 for objects that could interfere with proper operation of the utility meter 116.

Figure 7:
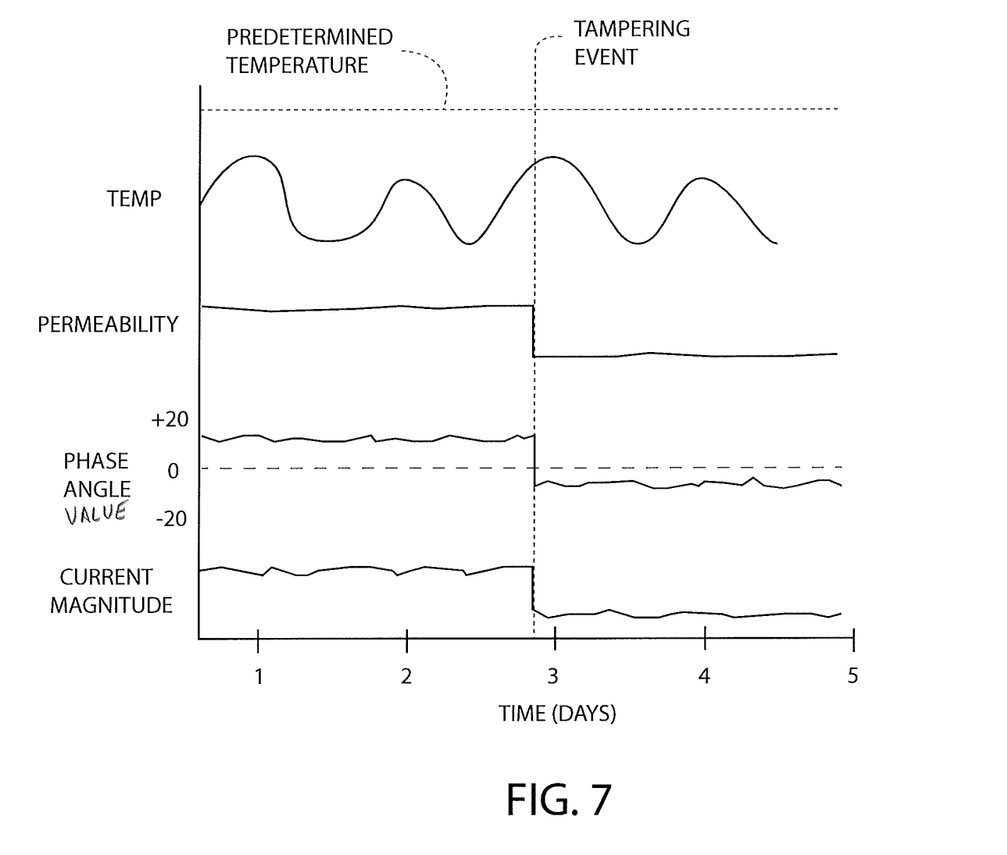
FIG. 7 is a graph of temperature, permeability, phase angle, and current magnitude for the utility meter of FIG. 1 showing the effects of meter tampering.

With reference to FIG. 7, a tampering event that is detectable by the fault detection system 140 includes influencing the magnetic permeability of the cores 222 of the current transformers 182a, 182b, 182c with a strong magnet (such as a neodymium iron boron magnet or another type of rare earth magnet). At the "tampering event" time a customer has placed a strong magnet very near the utility meter 116. The magnet has saturated the cores 222 of the current transformers 182a, 182b, 182c with the result that the current transformers 182a, 182b, 182c exhibit a sharp decline magnetic permeability. As previously set forth, the drop in magnetic permeability of the cores 222 results in the current through the current transformer windings 218 leading the voltage. Moreover, the drop in magnetic permeability of the cores 222 reduces the magnitude of the current through the current transformer windings 218, thereby reducing the apparent energy consumption values of the load 108, as measured by the metrology unit 186. Thus, the current transformers 182a, 182b, 182c are current sensors that are susceptible to measurement errors due to the application of an external magnetic field of sufficient strength. Introducing measurement errors is a means of energy theft. The magnetic tampering event is detectable by the fault detection system 140 by monitoring the phase angle value, which typically will not be negative (i.e. leading) for longer than the predetermined time period of the time delay in block 328 of the method 300.

While the disclosure has been illustrated and described in detail in the drawings and foregoing description, the same should be considered as illustrative and not restrictive in character. It is understood that only the preferred embodiments have been presented and that all changes, modifications, and further applications that come within the spirit of the disclosure are desired to be protected.

What is claimed is:

1. A fault detection system of a utility meter for measuring electrical energy consumed by a load, comprising:
   at least one current transformer configured to generate a current measurement signal based on a current provided to the load;
   a temperature sensor configured to generate a temperature signal based on a detected temperature of the utility meter, and
   a processor operably connected to the at least one current transformer and to the temperature sensor, the processor configured to generate a phase angle value corresponding to a phase angle of the current measurement signal, the processor further configured to generate a fault signal responsive to:
   determining that a first phase angle value indicates detection of leading current;
   in response to determining that the first phase angle value indicates detection of leading current, initiating a time delay of a predetermined time period; and
   determining, subsequent to the time delay, that the detected temperature is greater than a predetermined temperature value and a second phase angle value indicates detection of leading current.

2. The fault detection system of claim 1, wherein:
   the current transformer includes a core that undergoes a decrease in magnetic permeability when heated above the predetermined temperature value, and
   the decrease in magnetic permeability shifts the phase angle of the current measurement signal from a lagging phase angle to a leading phase angle as detected by the processor.

3. The fault detection system of claim 2, wherein:
   the current provided to the load has a lagging phase angle and
   the current measurement signal has a leading phase angle due to the decrease in the magnetic permeability of the core.

4. The fault detection system of claim 1, further comprising:
   at least one voltage sensor configured to detect voltage representative of voltage provided to the load and to generate a voltage measurement signal based on the detected voltage,
   wherein the processor is further configured to generate the phase angle value based on the phase angle of the current measurement signal relative to a phase angle of the voltage measurement signal.

5. The fault detection system of claim 1, wherein:
   the at least one current transformer is susceptible to measurement error due to application of an external magnetic field of sufficient strength thereto, and
   the processor is further configured to generate a meter tampering signal responsive to (i) generating the phase angle value indicating detection of the leading current for a duration greater than or equal to the predetermined time period, and (ii) the temperature signal indicating that the detected temperature is less than or equal to the predetermined temperature value.

6. The fault detection system of claim 1, further comprising:
   a display operably connected to the processor,
   wherein the processor is configured to illuminate at least a portion of the display responsive to generating the fault signal and to prevent consumption of electrical energy by the load when the fault signal is generated.

7. A utility meter for measuring electrical energy consumed by a load, comprising:
   at least one voltage sensor configured to detect voltage representative of voltage provided to the load and to generate a voltage measurement signal based on the detected voltage;
   at least one current sensor configured to detect current representative of current provided to the load and to generate a current measurement signal based on the detected current;
   a temperature sensor operably connected to detect a temperature of the utility meter and configured to generate a temperature signal based on the detected temperature;
   a processor operably connected to the at least one voltage sensor, the at least one current sensor, and the temperature sensor, the processor configured to generate a phase angle value corresponding to a phase angle of the current measurement signal based on a phase angle of the current measurement signal relative to a phase angle of the voltage measurement signal, the processor further configured to generate a fault signal responsive to determining that a first phase angle value indicates detection of leading current;

in response to determining that the first phase angle value indicates detection of leading current, initiating a time delay of a predetermined time period; and determining, subsequent to the time delay, that the detected temperature is greater than a predetermined temperature value and a second phase angle value indicates that the detected current leads the detected voltage.

8. The utility meter of claim 7, wherein:

the at least one current sensor includes a current transformer configured to generate the current representative of the current provided to the load, the current transformer includes a core that undergoes a decrease in magnetic permeability when heated above the predetermined temperature value, and the decrease in magnetic permeability shifts the phase angle of the current measurement signal and results in the detected current leading the detected voltage.

9. The utility meter of claim 8, wherein:

the current transformer includes a first winding formed by a current coil of the utility meter and a second winding operably connected to the current coil and the core, and electrically isolated from the current coil, the detected current is a current through the second winding.

10. The utility meter of claim 7, wherein generation of the fault signal corresponds to a hot socket condition of the utility meter.

11. The utility meter of claim 7, wherein:

the at least one current sensor is susceptible to measurement error due to application of an external magnetic field of sufficient strength thereto, and the processor is further configured to generate another fault signal responsive to (i) generating the phase angle value indicating that the detected current leads the detected voltage for a duration greater than or equal to the predetermined time period, and (ii) the temperature signal indicating that the detected temperature is less than or equal to the predetermined temperature value.

12. The utility meter of claim 11, wherein the other fault signal corresponds to magnetic tampering of the utility meter.

13. A method of operating a fault detection system of a utility meter for measuring electrical energy consumed by a load, the method comprising:

generating a current measurement signal based on a detected current corresponding to current provided to the load;

generating a phase angle value representative of a phase angle of the current measurement signal;

determining a temperature value corresponding to a temperature of the utility meter;

generating a fault signal responsive to:
determining that a first phase angle value indicates detection of leading current;
initiating a time delay of a predetermined time period;
determining, subsequent to the time delay, that the temperature of the utility meter is greater than a predetermined temperature value and a second phase angle value corresponds to leading current; and determining that the utility meter is undergoing a hot socket condition when the fault signal is generated.

14. The method of claim 13, further comprising:

preventing generation of the fault signal in response to the determined temperature value indicating that the temperature of the utility meter is greater than the predetermined temperature value and the second phase angle value corresponds to a lagging current to discriminate the hot socket condition from solar heating of the utility meter.

15. The method of claim 13, further comprising:

preventing generation of the fault signal if the phase angle value corresponds to a lagging current subsequent to the time delay.

16. The method of claim 13, further comprising:

determining a tampering event exists when the determined temperature value is less than the predetermined temperature value and the second phase angle value corresponds to a leading current subsequent to the time delay; and generating a tampering detection signal responsive to determining the tampering event exists.

17. The method of claim 16, further comprising:

preventing the consumption of electrical energy by the load when the fault signal or the tampering detection signal is generated.

* * * * *